United States Patent
Di Sarro et al.

(10) Patent No.: US 9,059,198 B2
(45) Date of Patent: Jun. 16, 2015

(54) BI-DIRECTIONAL SILICON CONTROLLED RECTIFIER STRUCTURE

(71) Applicant: International Business Machines Corporation, Armonk, NY (US)

(72) Inventors: James P. Di Sarro, Essex Junction, VT (US); Robert J. Gauthier, Jr., Hinesburg, VT (US); Junjun Li, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/492,622

(22) Filed: Sep. 22, 2014

(65) Prior Publication Data

US 2015/0050784 A1  Feb. 19, 2015

Related U.S. Application Data (62) Division of application No. 13/778,479, filed on Feb. 27, 2013, now Pat. No. 8,946,766.

(51) Int. Cl.
*H01L 29/87* (2006.01)
*H01L 29/66* (2006.01)
*H01L 29/74* (2006.01)
*H01L 27/02* (2006.01)

(52) U.S. Cl.
CPC .... *H01L 29/66386* (2013.01); *H01L 29/66371* (2013.01); *H01L 29/66121* (2013.01); *H01L 29/7416* (2013.01); *H01L 29/87* (2013.01); *H01L 27/0262* (2013.01); *H01L 29/7412* (2013.01); *H01L 27/0248* (2013.01)

(58) Field of Classification Search
CPC . H01L 27/0248; H01L 27/0262; H01L 29/87; H01L 29/7412; H01L 29/7416; H01L 29/66121; H01L 29/66371; H01L 29/66386
See application file for complete search history.

(56) References Cited

U.S. PATENT DOCUMENTS 3,967,192 A   6/1976   Kellogg et al.
5,548,135 A   8/1996   Avery
(Continued)

FOREIGN PATENT DOCUMENTS

CN   102569360 A   7/2012
CN   202394974 U   8/2012

OTHER PUBLICATIONS

"Bidirectional Diode-Triggered Silicon-Controlled Rectifiers for Low-Voltage ESD Protection" Wen Liu; Liou, J.J.; Han-Chih Yeh; Huei Wang; You Li; Kiat Seng Yeo Electron Device Letters, IEEE; vol. 33, Issue: 10 Publication Year: 2012, pp. 1360-1362.
"An Improved Bidirectional SCR Structure for Low-Triggering ESD Protection Applications" Zhiwei Liu; Vinson, J.; Lifang Lou; Liou, J.J. Electron Device Letters, IEEE; vol. 29, Issue: 4 Publication Year: 2008, pp. 360-362.
(Continued)

*Primary Examiner* — Minh-Loan Tran
*Assistant Examiner* — Fazli Erdem
(74) *Attorney, Agent, or Firm* — Wood, Herron & Evans, LLP; Anthony J. Canale (57) ABSTRACT

Fabrication methods for bi-directional silicon controlled rectifier device structures. A well of a first conductivity type is formed in a device region, which may be defined from a device layer of a semiconductor-on-insulator substrate. An anode of a first silicon controlled rectifier is formed in the first well. A cathode of a second silicon controlled rectifier is formed in the first well. The anode of the first silicon controlled rectifier has the first conductivity type. The cathode of the second silicon controlled rectifier has a second conductivity type opposite to the first conductivity type.

13 Claims, 8 Drawing Sheets

(56) References Cited

U.S. PATENT DOCUMENTS

| | | | |
|---|---|---|---|
| 5,780,905 | A | 7/1998 | Chen et al. |
| 6,011,681 | A | 1/2000 | Ker et al. |
| 6,074,899 | A | 6/2000 | Voldman |
| 6,353,237 | B1 | 3/2002 | Yu |
| 6,521,952 | B1 | 2/2003 | Ker et al. |
| 6,768,619 | B2 | 7/2004 | Ker et al. |
| 6,964,883 | B2 | 11/2005 | Chang |
| 7,023,029 | B1 | 4/2006 | Vashchenko et al. |
| 7,643,258 | B2 * | 1/2010 | Lai et al. ............... 361/56 |
| 7,777,277 | B2 | 8/2010 | Hung |
| 8,039,868 | B2 | 10/2011 | Gauthier, Jr. et al. |
| 8,089,127 | B2 | 1/2012 | Hung |
| 8,680,573 | B2 | 3/2014 | Di Sarro et al. |
| 2003/0205761 | A1 | 11/2003 | Chang |
| 2006/0043487 | A1 | 3/2006 | Pauletti et al. |
| 2010/0044748 | A1 * | 2/2010 | Lin et al. ............. 257/124 |
| 2011/0068366 | A1 | 3/2011 | Huang |
| 2011/0284925 | A1 | 11/2011 | Gauthier, Jr. et al. |
| 2012/0080717 | A1 | 4/2012 | Abou-Khalil et al. |
| 2013/0285111 | A1 * | 10/2013 | Di Sarro et al. .......... 257/107 |

OTHER PUBLICATIONS

A. Marichal et al., SCR based ESD protection in nanometer SOI technologies, 2005 Electrical Overstress/Electrostatic Discharge Symposium, Sep. 16, 2005.

A. Salman et al., Double well field effect diode: Lateral SCR-like device for ESD protection of I/Os in deep sub micron SOI, 29th Electrical Overstress/Electrostatic Discharge Symposium, Sep. 21, 2007.

M. Mergens, Advanced SCR ESD protection circuits for CMOS/SOI nanotechnologies, Proceedings of the Custom Integrated Circuits Conference, Sep. 21, 2005.

Gauthier, et al., Investigation of Voltage Overshoots in Diode Triggered Silicon Controlled Rectifiers (DTSCRs) Under Very Fast Transmission Line Pulsing (VFTLP), Overstress/Electrostatic Discharge Symposium Proceedings 2009 09-342 5A.4-9 and 4-10.

USPTO, Office Action issued in U.S. Appl. No. 13/778,479 dated May 8, 2014.

* cited by examiner

BI-DIRECTIONAL SILICON CONTROLLED RECTIFIER STRUCTURE

BACKGROUND

The present invention relates to semiconductor device fabrication and, more specifically, to bi-directional silicon controlled rectifier device structures and design structures, as well as methods for fabricating a bi-directional silicon controlled rectifier structure.

An integrated circuit may be exposed to random electrostatic discharge (ESD) events that can direct potentially large and damaging ESD currents to the integrated circuits of the chip. An ESD event refers to a phenomenon of electrical discharge of a current (positive or negative) for a short duration, during which a large amount of current is provided to the integrated circuit. The high current may be built-up from a variety of sources, such as the human body.

Precautions may be taken to avoid causing ESD events or to protect an integrated circuit from ESD events. One such precaution is to incorporate an ESD prevention circuit into the chip. The ESD protection circuit prevents damage to the sensitive devices of the integrated circuits during post-manufacture chip handling and after chip installation on a circuit board or other carrier. If an ESD event occurs, the ESD protection circuit triggers an ESD protection device, such as a silicon-controlled rectifier, to enter a low-impedance, conductive state that directs ESD current to ground and away from the sensitive devices in the integrated circuit on the chip. The ESD protection device clamps the ESD protection device in its conductive state until the ESD current is drained and the ESD voltage is discharged to an acceptable level.

One type of protection device that can be deployed in an ESD protection circuit is a silicon-controlled rectifier (SCR). The SCR is a unidirectional four-layer solid state device utilized in current control applications and includes three electrodes or terminals, namely an anode, a cathode, and a gate, that are distributed among the four layers. In its quiescent state, the SCR restricts current conduction to leakage current. However, a signal applied to the gate that causes the gate-to-cathode voltage to exceed an engineered threshold, known as the trigger voltage, can initiate the conduction of a forward current between the anode and cathode. In response to the triggering signal being removed from the gate, the SCR continues to conduct the forward current so long as the conducted current remains above an engineered holding current. When the conducted current drops below the holding current, the SCR returns to its quiescent state.

Improved bi-directional silicon controlled rectifier device structures and design structures, as well as fabrication methods, are needed.

SUMMARY

According to one embodiment of the present invention, a method of fabricating a device structure includes forming a well of a first conductivity type in a device region, and forming a doped region of a second conductivity type in the well. A cathode of a silicon controlled rectifier is formed in the device region and a cathode of a diode is formed in the device region. The silicon controlled rectifier comprises a first portion of the well and an anode comprised of a first portion of the doped region. The diode comprises a second portion of the well and an anode comprised of a second portion of the doped region.

According to another embodiment of the present invention, a device structure includes a first well of a first conductivity type in a device region, a first silicon controlled rectifier including an anode in the first well, and a second silicon controlled rectifier including a cathode in the first well. The anode of the first silicon controlled rectifier has the first conductivity type. The cathode of the second silicon controlled rectifier has a second conductivity type opposite to the first conductivity type.

According to another embodiment of the present invention, a design structure is provided that is readable by a machine used in design, manufacture, or simulation of an integrated circuit. The design structure includes a first well of a first conductivity type in a device region, a first silicon controlled rectifier including an anode in the first well, and a second silicon controlled rectifier including a cathode in the first well. The anode of the first silicon controlled rectifier has the first conductivity type. The cathode of the second silicon controlled rectifier has a second conductivity type opposite to the first conductivity type. The design structure may comprise a netlist. The design structure may also reside on storage medium as a data format used for the exchange of layout data of integrated circuits. The design structure may reside in a programmable gate array.

BRIEF DESCRIPTION OF THE SEVERAL VIEWS OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
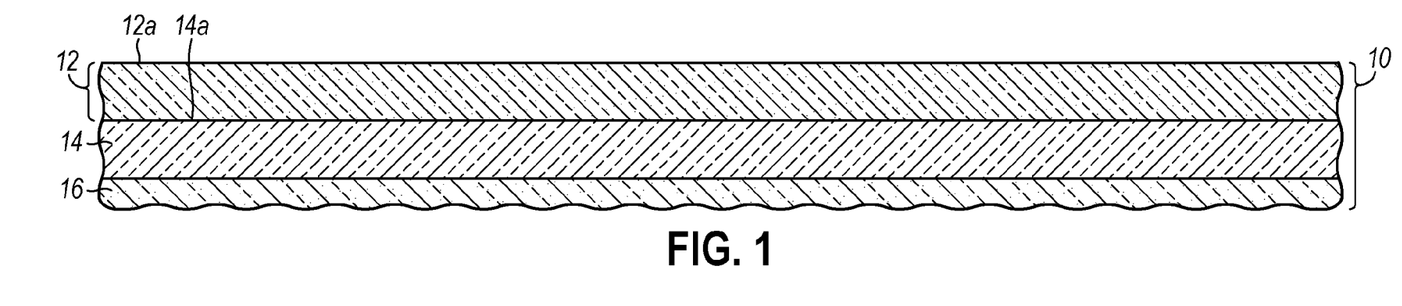
FIG. 1 is a cross-sectional view of a portion of a substrate at an initial fabrication stage of a processing method for forming a device structure in accordance with an embodiment of the invention.

With reference to FIG. 1 and in accordance with an embodiment of the invention, a semiconductor-on-insulator (SOI) substrate 10 includes a device layer 12, a buried insulator layer 14, and a handle wafer 16. The device layer 12 is separated from the handle wafer 16 by the intervening buried insulator layer 14 and is in direct contact along a planar interface with a top surface 14a of the buried insulator layer 14. The buried insulator layer 14 electrically insulates the handle wafer 16 from the device layer 12, which is considerably thinner than the handle wafer 16. The buried insulator layer 14 may be comprised of an electrical insulator and, in particular, may be comprised of silicon dioxide (e.g., $SiO_2$) to constitute a buried oxide layer.

The device layer 12 and handle wafer 16 may be comprised of a monocrystalline semiconductor material, such as single crystal silicon or another crystalline semiconductor material that contains primarily silicon, and the semiconductor material of the device layer 12 may be device quality. The device layer 12 may have a thickness measured from its top surface 12a to a top surface 14a of the buried insulator layer 14 ranging from two (2) nm to 150 nm. The SOI substrate 10 may be fabricated by any suitable conventional technique, such as wafer bonding techniques or separation by implantation of oxygen (SIMOX) techniques, familiar to a person having ordinary skill in the art.

With reference to FIGS. 2, 2A, 2B, 2C in which like reference numerals refer to like features in FIG. 1 and at a subsequent fabrication stage, a plurality of device regions 18, 19, 20 are formed from the device layer 12 and are in proximity to each other. The device regions 18, 19, 20 are surrounded by trench isolation structures 22, which supply electrical isolation. The device regions 18, 19, 20 have respective top surfaces 18a, 19a, 20a that are nominally co-planar with a top surface 22a of the trench isolation structures 22. The respective sizes, geometrical shapes, and outer perimeters of the device regions 18, 19, 20 are defined by the locations and arrangement of the trench isolation structures 22.

Figure 2:
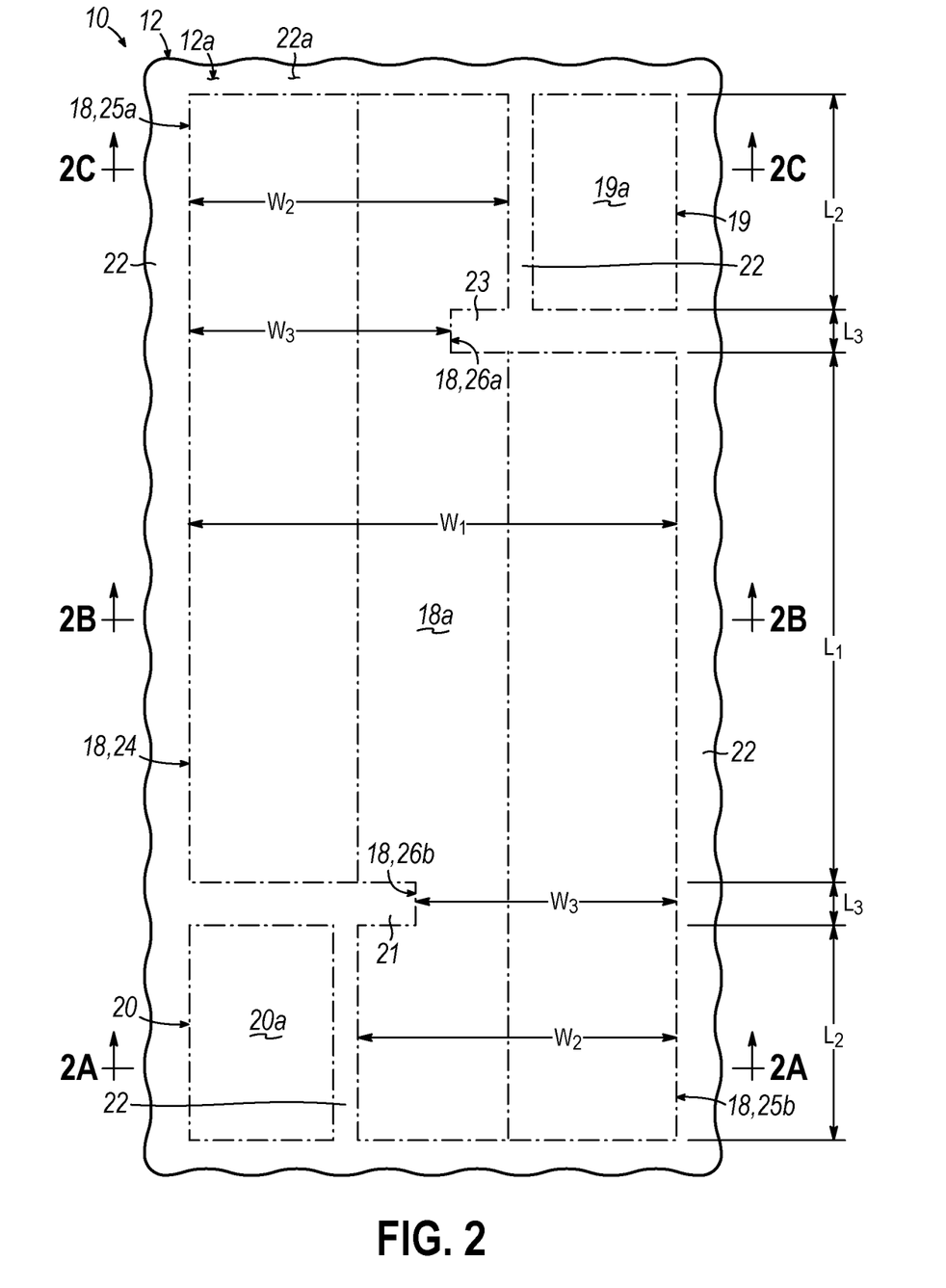
FIG. 2 is a top view of the substrate portion of a substrate at a fabrication stage of the device structure subsequent to FIG. 1.
Figure 2A:
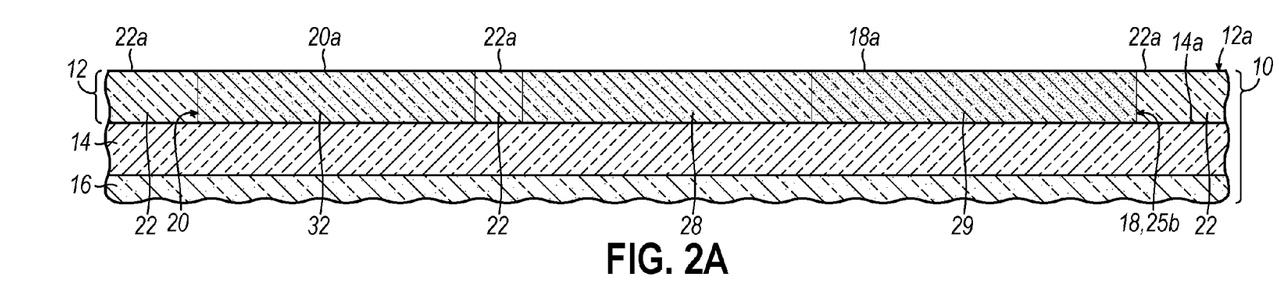
FIG. 2A is a cross-sectional view taken generally along line 2A-2A in FIG. 2.
Figure 2B:
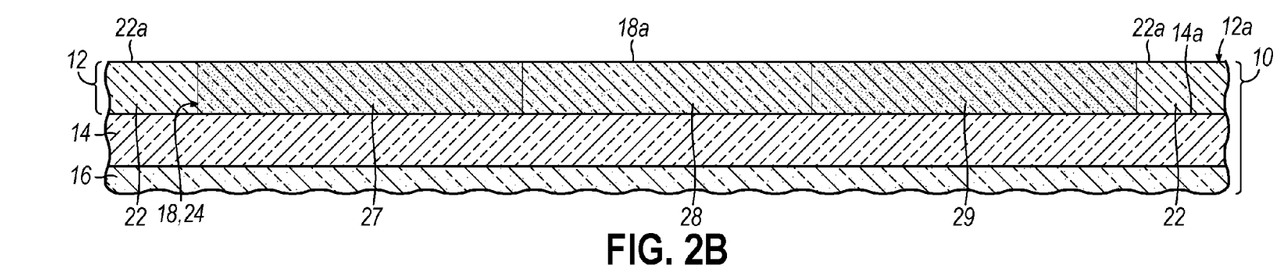
FIG. 2B is a cross-sectional view taken generally along line 2B-2B in FIG. 2.
Figure 2C:
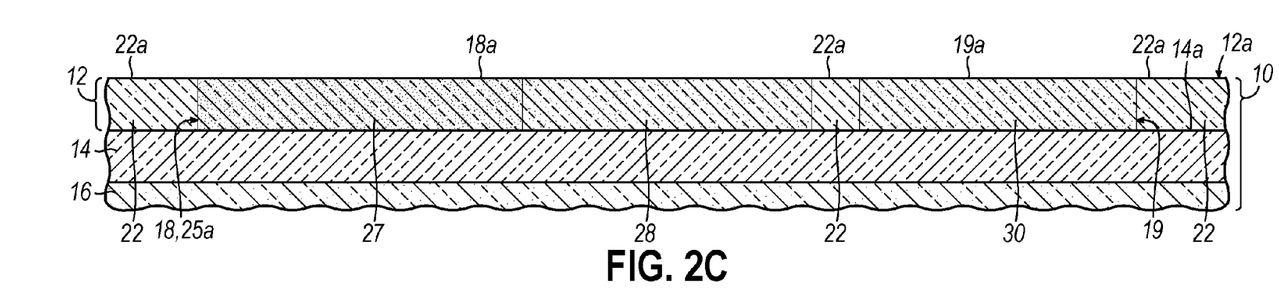
FIG. 2C is a cross-sectional view taken generally along line 2C-2C in FIG. 2.

The trench isolation structures 22 may be isolation structures formed by a shallow trench isolation (STI) technique that relies on lithography and dry etching processes to define trenches that reach in depth to the top surface 14a of the buried insulator layer 14, deposits an electrical insulator to fill the trenches, and planarizes the electrical insulator relative to the top surface 12a of the device layer 12 (FIG. 1) using, for example, a chemical mechanical polishing (CMP) process. The trench isolation structures 22 may be comprised of a dielectric material, such as an oxide of silicon and, in particular, densified tetraethylorthosilicate (TEOS) deposited by chemical vapor deposition (CVD).

Device region 18 has a non-rectangular geometrical shape with a larger section 24, smaller sections 25a, 25b, a connecting section 26a that joins section 24 with section 25a, and a connecting section 26b that joins section 24 with section 25a. Section 25a of device region 18 is positioned proximate to device region 19 so that their nearest-neighbor edges are separated by one of the trench isolation structures 22. Similarly, section 25b of device region 18 is positioned proximate to device region 20 so that their nearest-neighbor edges are separated by one of the trench isolation structures 22. Sections 25a, 25b are appended to opposite ends of section 24.

Section 24 of device region 18 has a width, $W_1$, sections 25a, 25b of device region 18 each have a width, $W_2$, that is smaller than the width, $W_1$, of section 24, and sections 26a, 26b of device region 18 have a width, $W_3$, that is smaller than width, $W_1$, or width, $W_2$. The difference in the width of sections 25a, 25b and sections 26a, 26b arises from respective trench isolation structures 21, 23 from among the various trench isolation structures 22. Trench isolation structure 21 is positioned between a portion of section 24 and a portion of section 25b. Trench isolation structure 23 is positioned between a portion of section 24 and a portion of section 25a.

Section 24 has an individual length, $L_1$, sections 25a, 25b have an individual length, $L_2$, and sections 26a, 26b have an individual length, $L_3$, so that the device region 18 has a total length given by the sum of the individual lengths. Device region 19 may have a length approximately equal to the length, $L_2$, of section 25a of device region 18. Device region 20 may have a length approximately equal to the length, $L_2$, of section 25b of device region 18.

Section 24 of device region 18 includes a plurality of wells 27, 28, 29 that are juxtaposed with well 28 centrally located between well 27 and well 29. Wells 27, 28, but not well 29, are present in section 25a of device region 18. Wells 28, 29, but not well 27, are present in section 25b of device region 18. Device region 19 includes a well 30 and device region 20 includes a well 32. Wells 27-29 are comprised of lightly-doped semiconductor material, and well 28 has an opposite conductivity type from wells 27, 29. Wells 30, 32 are also comprised of lightly-doped semiconductor material and, in the representative embodiment, have the same conductivity type as well 28.

Wells 28, 30, 32 may be concurrently formed by implanting ions of an impurity species into the device regions 18, 20 in the presence of a patterned mask (not shown) applied to the top surface of the device layer 12. Wells 27, 29 may be concurrently formed by implanting ions of an impurity species into the device regions 18, 20 in the presence of a different patterned mask (not shown) applied to the top surface of the device layer 12. Each patterned mask controls dopant introduction into device regions 18, 20 during implantation by stopping the implanted ions within its thickness so that the device layer 12 is selectively implanted with the impurity species to respectively form the wells 27-29, 30, 32. Each patterned mask may be a photoresist layer having a window aligned with the intended location of one of the wells 27-29, 30, 32 and formed in the mask using a photolithographic patterning process. The implantation conditions (e.g., kinetic energy and dose) are selected to form each of the wells 27-29, 30, 32 with a desired doping concentration (e.g., light doping). After ion implantation is complete, each patterned mask is removed by, for example, oxygen plasma ashing or wet chemical stripping.

In a representative embodiment, the constituent semiconductor material of wells 28, 30, 32 may have n-type conductivity and the constituent semiconductor material of wells 27, 29 may have p-type conductivity. To that end, the wells 28, 30, 32 may each comprise lightly-doped n-wells formed by implanting ions of an impurity species from Group V of the Periodic Table (e.g., phosphorus (P), arsenic (As), or antimony (Sb)) and the wells 27, 29 may each comprise lightly-doped p-wells formed by implanting ions of an impurity species from Group III of the Periodic Table (e.g., boron (B), aluminum (Al), gallium (Ga), or indium (In)).

As used herein, the dopant concentration in semiconductor material that is considered heavily doped may be at least an order of magnitude higher than the dopant concentration in semiconductor material that is considered lightly doped. For example, a representative dopant concentration for heavily-doped semiconductor material may be greater than or equal to $10^{18}$ $cm^{-3}$, and a representative dopant concentration for lightly-doped semiconductor material may be less than or equal to $10^{16}$ $cm^{-3}$.

With reference to FIGS. 3, 3A, 3B, 3C, 3D in which like reference numerals refer to like features in FIGS. 2, 2A-C and at a subsequent fabrication stage, a mask feature 34 is formed on the top surface of device region 18, a mask feature 35 is formed on the top surface of device region 19, and a mask feature 36 is formed on the top surface of device region 20. Mask feature 34 covers a portion of well 28, a portion of well 29, and a portion of well 30. Mask feature 35 covers a portion of well 30 and mask feature 36 covers a portion of well 32.

Figure 3:
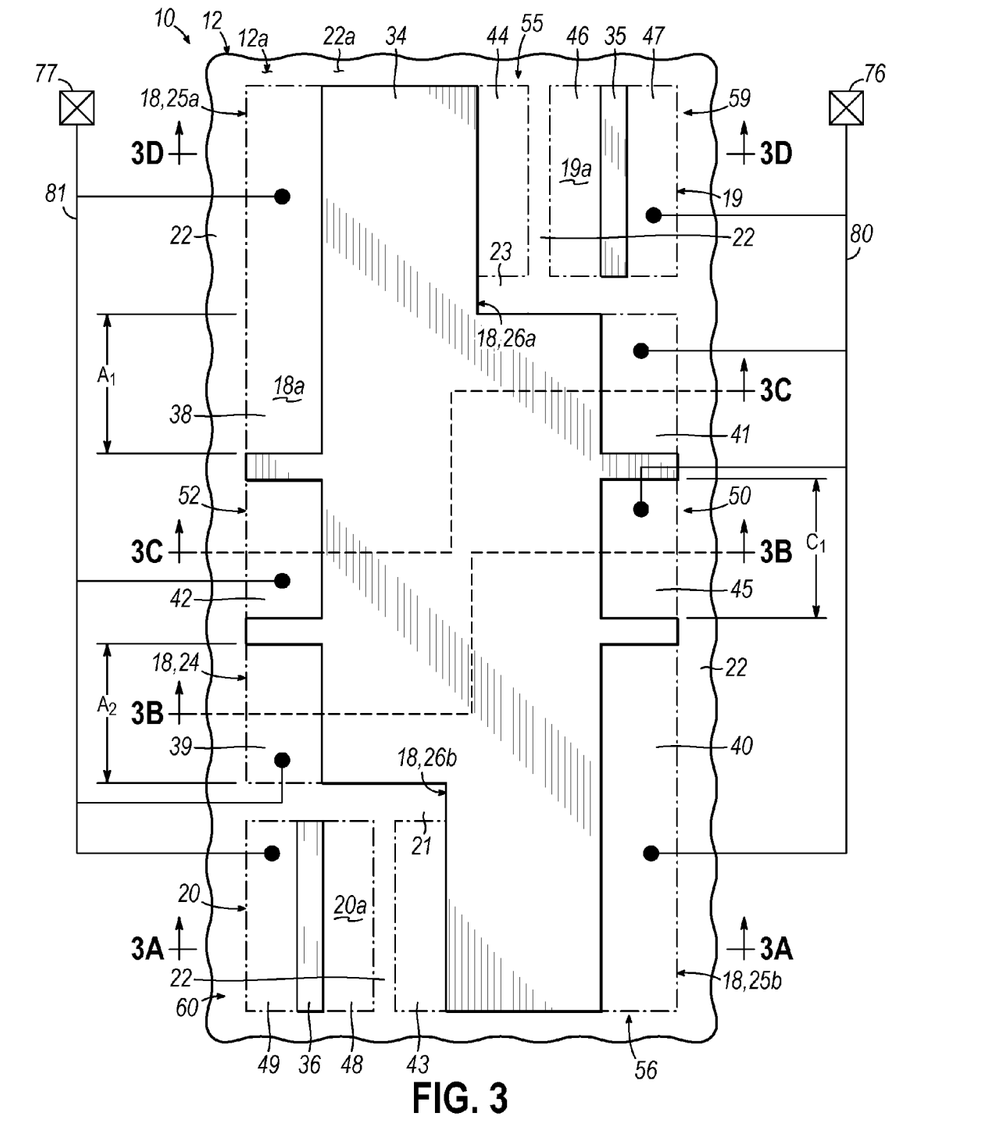
FIG. 3 is a top view of the substrate portion of FIG. 2 at a fabrication stage of the device structure subsequent to FIG. 2.

The mask features 34, 35, 36 may be comprised of a non-conductive dielectric material that is an electrical insulator and, in particular, may be comprised of a silicide blocking material, such as a nitride, oxide, or oxynitride of silicon deposited by CVD or PVD, that is used in a CMOS process to block silicide formation. The mask features 34, 35 may be patterned from a layer of the non-conductive dielectric material using photolithography and etching processes. To that end, the layer of the non-conductive dielectric material is deposited on the top surfaces 18a, 19a, 20a and a sacrificial layer is subsequently applied. The sacrificial layer may be comprised of a photoresist that is applied by a spin coating process, pre-baked, exposed to a radiation projected through a photomask, baked after exposure, and developed with a chemical developer to form an etch mask that includes features coinciding with the intended locations of mask features 34, 35, 36. The feature is transferred from the sacrificial layer by the etching process to the layer to define the boundaries of the mask features 34, 35, 36. The etching process may comprise a dry etching process, such as reactive-ion etching (RIE) that produces vertical sidewalls. The etching process, which may be conducted in a single etching step or multiple steps, relies on one or more etch chemistries and may comprise a timed etch or an end-pointed etch. The sacrificial layer is removed in response to forming the mask features 34, 35. If comprised of a photoresist, the sacrificial layer may be removed by ashing or solvent stripping, followed by surface cleaning.

Doped regions 38-45 comprised of heavily-doped semiconductor material are formed at selected locations in device region 18, doped regions 46, 47 comprised of heavily-doped semiconductor material are formed at selected locations in device region 19, and doped regions 48, 49 comprised of heavily-doped semiconductor material are formed at selected locations in device region 20. Doped regions 38-41, 46, 48 are comprised of semiconductor material of one conductivity type and doped regions 42-45, 47, 49 are comprised of semiconductor material of the opposite conductivity type.

In device region 18, doped regions 38, 39 are located in well 27 and doped regions 40, 41 are located in well 29. In the representative embodiment, doped region 38 is present in sections 24, 25a of device region 18, doped region 39 is present in section 24 of device region 18, and doped region 41 is present in section 25a of device region 18. In device region 18, doped region 42 is located in well 27, doped regions 43, 44 are located in well 28, and doped region 45 is located in well 29. In the representative embodiment, doped regions 42, 45 are present in section 24 of device region 18, doped region 43 is present in section 25a of device region 18, and doped region 44 is present in section 25b of device region 18. The formation of the doped regions 38-45 effectively reduces the size of the wells 28, 30, 32. In device region 19, the doped region 46, 47 of opposite conductivity type are located in well 30. In device region 20, the doped region 48, 49 of opposite conductivity type are located in well 30.

Mask feature 34 covers a portion of well 28, a portion of well 29, and a portion of well 30, which remain after the ion implantations forming heavily-doped regions 38-45. Mask feature 35 covers a portion of well 30 that remains after subsequent ion implantations in the portion of the process flow forming heavily-doped regions 46, 47. Mask feature 36 covers a portion of well 32 that remains after subsequent ion implantations in the process flow forming heavily-doped regions 48, 49.

Doped regions 38-41, 46, 48 may be formed by implanting ions of an impurity species into the device regions 18, 19, 20 in the presence of a patterned sacrificial layer applied to the top surface of the device layer 12. The mask features 34, 35, 36 and sacrificial layer cooperate to spatially control dopant introduction into device regions 18, 19, 20 during implantation by stopping the implanted ions so that the device regions 18, 19, 20 are selectively implanted with the impurity species forming doped regions 38-41, 46, 48. The sacrificial layer may be a resist layer having openings aligned with the intended location of the doped regions 38-41 in device region 18, the doped region 46 in device region 19, and the doped region 48 in the device region 20. The openings may be formed in the sacrificial layer using a photolithographic patterning process. Implantation conditions (e.g., kinetic energy and dose) are selected to form the doped regions 38-41, 46, 48 with a desired doping concentration (e.g., heavy doping). After ion implantation is complete, the sacrificial layer is removed by, for example, oxygen plasma ashing or wet chemical stripping.

Doped regions 42-45, 47, 49 may be formed by implanting ions of an impurity species into the device regions 18, 19, 20 in the presence of a patterned sacrificial layer applied to the top surface of the device layer 12. In the representative embodiment, the doped regions 42-45, 47, 49 may be formed after the formation of doped regions 38-41, 46, 48. The mask features 34, 35, 36 and sacrificial layer cooperate to spatially control dopant introduction into device regions 18, 19, 20 during implantation by stopping the implanted ions so that the device regions 18, 19, 20 are selectively implanted with the impurity species forming doped regions 42-45, 47, 49. The sacrificial layer may be a resist layer having openings aligned with the intended location of the doped regions 42-45 in device region 18, the doped region 47 in device region 19, and the doped region 49 in the device region 20. The openings may be formed in the sacrificial layer using a photolithographic patterning process. Implantation conditions (e.g., kinetic energy and dose) are selected to form the doped regions 42-45, 47, 49 with a desired doping concentration (e.g., heavy doping). After ion implantation is complete, the sacrificial layer is removed by, for example, oxygen plasma ashing or wet chemical stripping.

In a representative embodiment in which well 28 is a lightly-doped n-well and wells 27, 29 are lightly-doped p-wells, doped regions 38-41 are heavily doped to have p-type conductivity and doped regions 42-45 are heavily doped to have n-type conductivity. In this representative embodiment, well 30 is a lightly-doped n-well, doped region 46 is heavily doped to have p-type conductivity, and doped region 47 may be heavily doped to have n-type conductivity. In this representative embodiment, well 32 is a lightly-doped n-well, doped region 48 is heavily doped to have p-type conductivity, and doped region 49 may be heavily doped to have n-type conductivity. Doped regions 38-41, 46, 48 are implanted with a dopant from Group III of the Periodic Table and doped regions 42, 45, 47, 49 are implanted with a dopant from Group V of the Periodic Table.

The resultant bidirectional SCR device structure includes a silicon controlled rectifier (SCR) 50, a silicon controlled rectifier (SCR) 52, a diode 55, and a diode 56 in device region 18, a diode 59 in device region 19, and a diode 60 in device region 20. SCR 50 and SCR 52 collectively occupy section 24 of the device region 18, diode 55 is located in section 25a of the device region 18, and diode 56 is located in section 25b of the device region 18. The doped region 39 in section 24 and the portion of doped region 38 in section 24 that is separated from doped region 39 may collectively represent an anode of the SCR 50, the doped region 45 in section 24 may represent a cathode of the SCR 50, and the well 28 may represent a gate of the SCR 50. The portion of doped region 38 in section 25a of the device region is not in the current path of SCR 50. The doped region 41 in section 24 and the portion of doped region 40 in section 24 separated from doped region 41 may collectively represent an anode of the SCR 52, the doped region 42 in section 24 may represent a cathode of the SCR 52, and the well 28 may represent a gate of the SCR 52 that is shared with the gate of SCR 52. The portion of doped region 38 in section 25a of the device region is not in the current path of SCR 52.

The SCR 50 (FIGS. 3, 3B) includes a plurality of p-n junctions 62, 63, 64 across each of which the conductivity type of the semiconductor material changes. A portion of well 28 is butted with a portion of well 27 along an interface in section 24 of device region 18 to define the p-n junction 62. The portion of well 28 is also butted along an interface in section 24 of device region 18 with a portion of well 29 to define the p-n junction 63. This portion of well 29 is butted along an interface with doped region 45 that defines the p-n junction 63. Doped region 39 and the portion of doped region 38 in section 24 collectively supply a contact to the well 27.

The SCR 52 (FIGS. 3, 3C) includes a plurality of p-n junctions 66, 67, 68 across each of which the conductivity type of the semiconductor material changes. A portion of well 28 is butted with a portion of well 29 along an interface in section 24 of device region 18 to define the p-n junction 66. The portion of well 28 is also butted along an interface in section 24 of device region 18 with a portion of well 27 to define the p-n junction 67. This portion of well 27 is butted along an interface with doped region 43 that defines the p-n junction 68. Doped region 41 and the portion of doped region 40 in section 24 collectively supply a contact to the well 29 and define an anode area. Doped region 43 defines the anode area.

The mask feature 34 overlies the wells 27, 28, 29 and the p-n junctions 62, 63, 66, 67. Side edges 31, 33 of the mask feature 34 respectively define the locations of the p-n junctions 64, 68. The distance between the anode and the cathode of each of the SCRs 50, 52 is generally defined by the width between the side edges 31, 33 of the mask feature 34 in section 24.

Diode 56 (FIGS. 3, 3A) in section 25a of device region 18 includes a p-n junction 69 defined along an interface by the butting of doped region 43 and a portion of well 28 that is coextensive with doped region 43. The p-n junction 69 of diode 56 is localized in section 25b of device region 18. Doped region 43 supplies a cathode of the diode 56 that is separated from the anode (a portion of well 29 and doped region 40) by the portion of well 28. The doped region 43 and the portions of wells 28, 29 are aligned across the width of the device region 18.

Figure 3A:
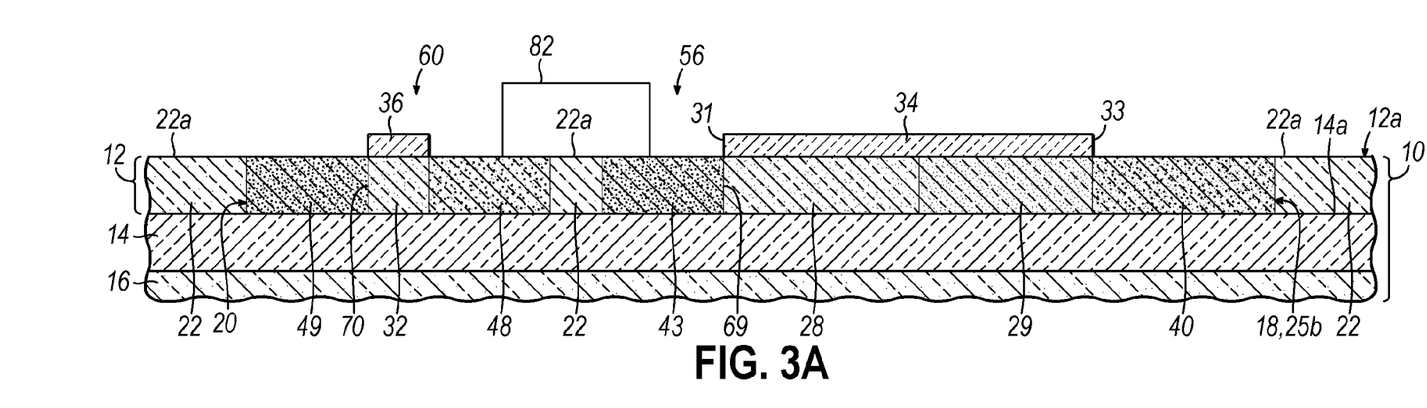
FIG. 3A is a cross-sectional view taken generally along line 3A-3A in FIG. 3.
Figure 3B:
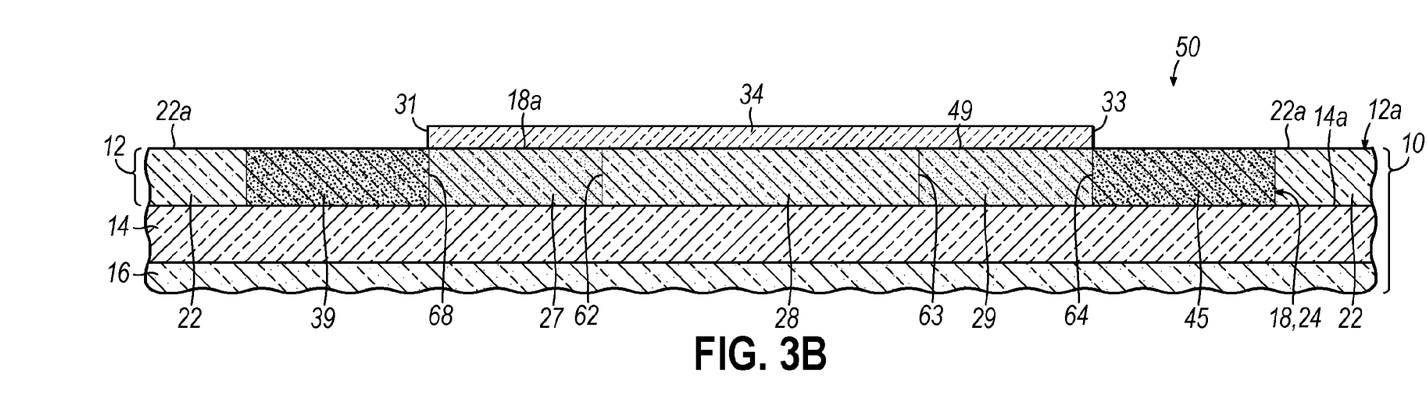
FIG. 3B is a cross-sectional view taken generally along line 3B-3B in FIG. 3.
Figure 3C:
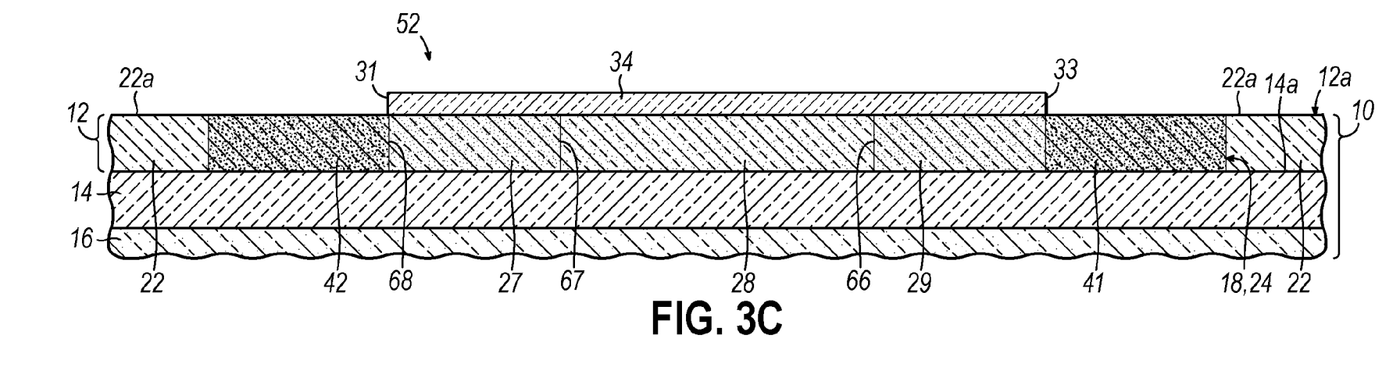
FIG. 3C is a cross-sectional view taken generally along line 3C-3C in FIG. 3.

Diode 56 shares the doped region 40 and the wells 28, 29 in common with the SCR 50 so that diode 56 is integrated into the same device region 18 as SCR 50. The cathode of the diode 56, namely the doped region 43 in section 25a of device region 18, is separated from the SCR 50 in section 24 of device region 18 by the trench isolation structure 21. The junction 68 of the diode 56 has the same orientation as the junctions 62, 63, 64 of SCR 50, namely along the length of the device region 18. Specifically, the junction 68 of diode 56 is aligned parallel with the junctions 62, 63, 64 of SCR 50.

Doped regions 48, 49 and well 32 of diode 60 (FIGS. 3, 3A) are localized in device region 20. Doped region 49 is physically disposed in the well 32 and is comprised of heavily-doped semiconductor material having an opposite conductivity type from the lightly-doped semiconductor material of well 32. Doped region 48 is also physically disposed in the well 32 and is separated from doped region 49 by well 32. The well 32 and doped region 49 are butted along an interface that defines a p-n junction 70. Doped region 48 supplies a contact to the well 32 and functions as a cathode of the diode 60. Doped region 48 is connected by wiring to the doped region 43 of diode 56 in device region 20.

Diode 55 (FIGS. 3, 3D) in section 25a of device region 18 includes a p-n junction 69 defined along an interface by the butting of doped region 44 and a portion of well 28 that is coextensive with doped region 44. The p-n junction 69 of diode 55 is localized in section 25a of device region 18. Doped region 44 supplies a cathode of the diode 55 that is separated from the anode (a portion of well 27 and doped region 38) by the portion of well 28. The doped region 44 and the portions of wells 27, 28 are aligned across the width of the device region 18. The junction 69 of diode 55 is aligned parallel to the junctions 62, 63, 64 of SCR 52. Specifically, the junction 68 of diode 56 is aligned parallel with the junctions 62, 63, 64 of SCR 50, which are also aligned parallel with junction 68 of diode 56 and junctions 62, 63, 64 of SCR 50.

Figure 3D:
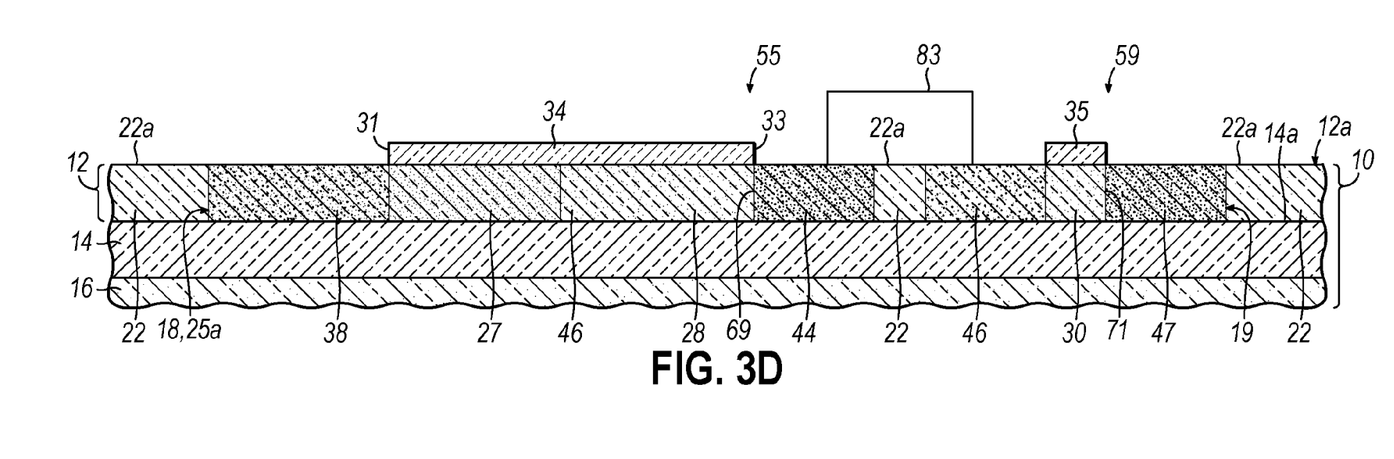
FIG. 3D is a cross-sectional view taken generally along line 3D-3D in FIG. 3.

Diode 55 shares the doped region 38 and the wells 27, 28 in common with the SCR 52 so that diode 55 is integrated into the same device region 18 as SCR 52. The junction 69 of the diode 55 has the same orientation as the junctions 66, 67, 68 of SCR 52, namely along the length of the device region 18. The cathode of the diode 55, namely doped region 44 in section 25b of device region 18, is separated from the SCR 52 in section 24 of device region 18 by the trench isolation structure 23.

Doped regions 46, 47 and well 30 of diode 59 (FIGS. 3, 3D) are localized in device region 19. Doped region 47 is physically disposed in the well 30 and is comprised of heavily-doped semiconductor material having an opposite conductivity type from the lightly-doped semiconductor material of well 30. Doped region 46 is also physically disposed in the well 30 and separated from doped region 47 by well 30. The well 30 and doped region 47 are butted along an interface that defines a p-n junction 71. Doped region 46 supplies a contact to the well 30 and functions as a cathode of the diode 55. Doped region 46 is connected by wiring to the doped region 44 of diode 55 in device region 20.

The ratio of the cathode area to anode area for each of the SCRs 50, 52 in the representative embodiment is approximately 2 to 1. For example, the anode area of SCR 50 is given by the sum of the area of the portion of doped region 38 in section 24 of device region 18 and the area of the doped region 39. The area of the portion of doped region 38 in section 24 of device region 18 may be numerically calculated as the product of its width and the length $A_1$. The area of doped region 39 may be numerically calculated as the product of its width and the length $A_2$. The cathode area of SCR 50 is given by the area of the doped region 45, which may be numerically calculated as the product of its width and the length $C_1$. The cathode and anode areas of SCR 52 may be calculated in the same or a similar manner.

Figure 5:
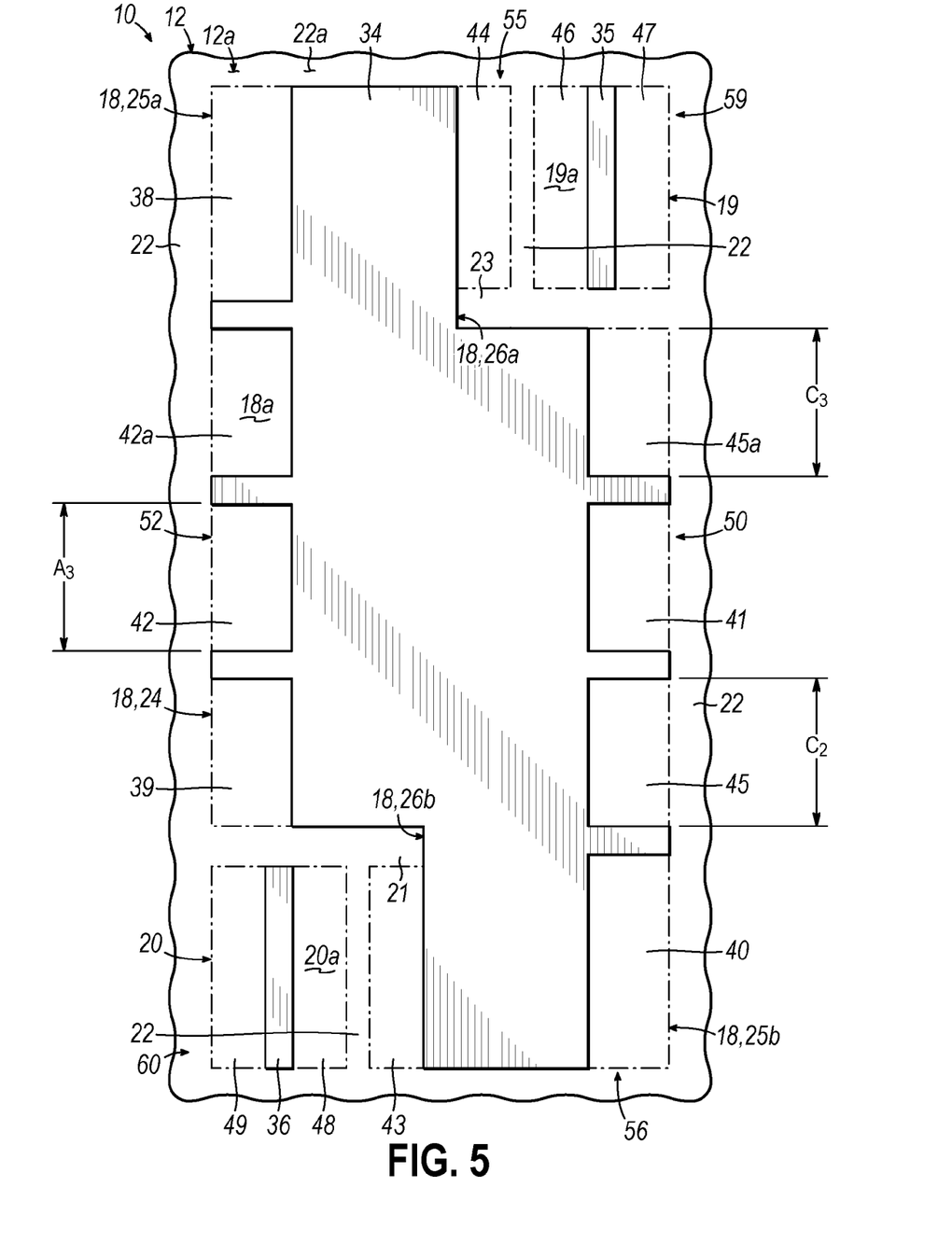
FIG. 5 is a top view of a device structure in accordance with an alternative embodiment of the invention.

The ratio of the cathode area to anode area for each of the SCRs 50, 52 may be altered by adjusting the doped regions in section 24 of device region 18. For example and as shown in FIG. 5, the doped regions 39, 42 and the doped regions 42, 45 are rearranged in section 24 of the device region 18. Additional doped regions 42a, 45a are added to section 24 of the device region 18 and have the same conductivity type as doped regions 42, 45. Doped regions 38 and 40 have shortened lengths so that each is outside of section 24 of the device region 18. In the embodiment of FIG. 5, the effective length of the anode has been halved and the effective length of the cathode has been doubled so that the ratio of the cathode area to anode area for each of the SCRs 50, 52 in the representative embodiment is approximately 1 to 2. For example, the cathode area of SCR 50 is given by the sum of the area of doped region 42 and the area of doped region 42*a*. The area of doped region 42 may be numerically calculated as the product of its width and the length $C_2$. The area of doped region 42*a* may be numerically calculated as the product of its width and the length $C_3$. The anode area of SCR 50 is given by the area of the doped region 45, which may be numerically calculated as the product of its width and the length $A_3$. The cathode area and anode area of SCR 52 may be calculated in the same or a similar manner.

Standard processing follows the formation of the device structure to provide contacts to SCR 50, SCR 52, and diodes 55, 56, 59, 60, and to also furnish connective wiring in a back-end-of-line (BEOL) interconnect structure.

The SCR 50 and at least one protected integrated circuit 78 (FIG. 4) may be coupled by a wiring path 80 to a pad 76, which may be, for example, a ground pad or an input/output (I/O) pad. More specifically, the portion of doped region 38 in section 24 of device region 18 and the doped region 39 of SCR 50 (i.e., collectively the anode of the SCR 50) may be coupled with the pad 76 by the wiring path 80. In addition, the wiring path 80 also couples the portion of the doped region 38 in section 25*b* of device region 18 (i.e., the anode of the diode 55) with the pad 76. The cathode of diode 56 and the anode of diode 60 are coupled by a wiring path 82 to define a diode string.

The SCR 52 and at least one protected integrated circuit 79 (FIG. 4) may be coupled by a wiring path 81 to a pad 77, which may be, for example, a ground pad or an input/output (I/O) pad and which is different from pad 76. More specifically, the portion of doped region 40 in section 24 of device region 18 and the doped region 41 of SCR 52 (i.e., collectively the anode of the SCR 52) may be commonly coupled with the pad 77 by a wiring path 81. In addition, the pad 77 also couples the portion of the doped region 40 section 25*a* of device region 18 (i.e., the anode of the diode 55) with the pad 77. The cathode of diode 55 and the anode of diode 59 are coupled by a wiring path 83 to define a diode string.

Figure 4:
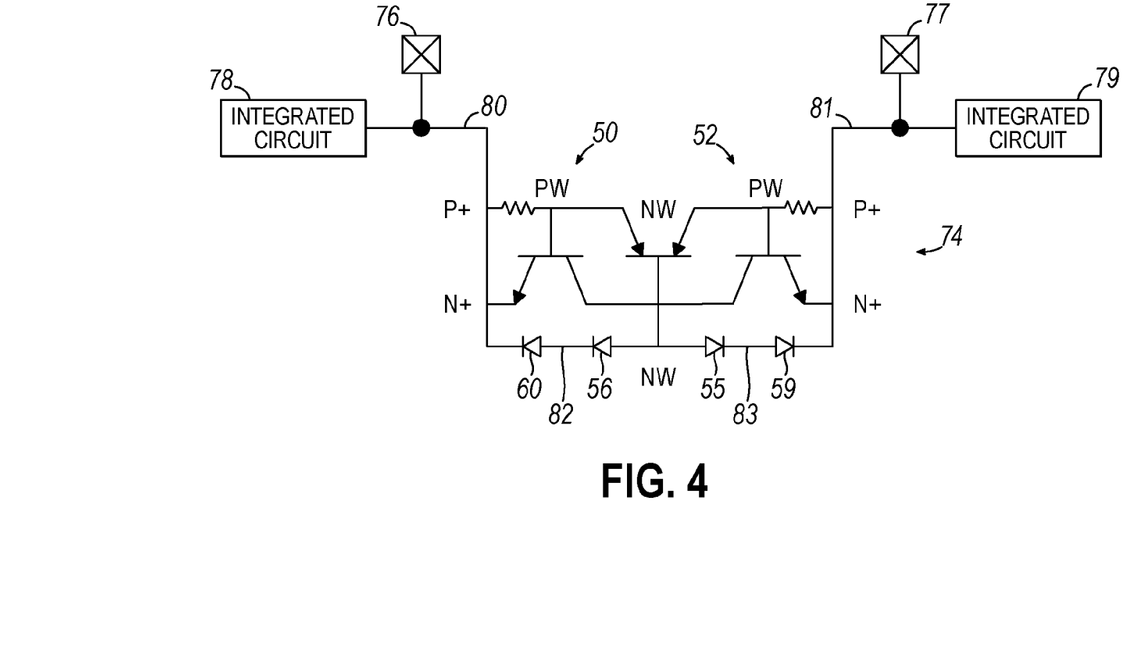
FIG. 4 is a schematic view of an equivalent circuit for the device structure of FIGS. 3, 3A-3D.

Collectively, the SCRs 50, 52 constitute a bi-directional SCR structure that may be employed in an electrostatic discharge (ESD) protection circuit configured to divert current from an ESD pulse to ground and away from sensitive integrated circuits. The diodes 56, 60 may be used as trigger devices to trigger the SCR 50 in response to an ESD pulse. The diodes 55, 59 may be used as trigger devices to trigger the SCR 52 in response to an ESD pulse.

With reference to FIG. 4 in which like reference numerals refer to like features in FIGS. 3, 3A-C, an ESD protection circuit 74 may include the composite bi-directional SCR device structure comprised of SCR 50 and SCR 52, as well as the diodes 55, 56, 59, 60 that can be employed to trigger the SCRs 50, 52. The diode string comprising diodes 56, 60 is configured to respond to an ESD pulse at pad 76 by triggering the SCR 50 to enter a low-impedance conducting state. In this state, a current-carrying path for the ESD current is defined through the SCR 50 from the pad 76 to the pad 77. When triggered, the SCR 50 is induced to enter the low-impedance conducting state and thereby divert the current from the ESD pulse occurring at pad 76 to the current-carrying path and away from the protected integrated circuit 78. The SCR 50 is held in the low-impedance conducting state so long as the ESD current is flowing through the current-carrying path. At the conclusion of the ESD event, the SCR 50 reverts to its high-impedance non-conducting state and remains off until triggered by another ESD pulse at pad 76.

The diode string comprising diodes 55, 59 is configured to respond to an ESD pulse at pad 77 by triggering the SCR 52 to enter a low-impedance conducting state. In this state, a current-carrying path for the ESD current is defined through the SCR 52 from the pad 77 to the pad 76. When triggered, the SCR 52 is induced to enter the low-impedance conducting state and thereby divert the current from the ESD pulse at pad 77 to the current-carrying path and away from the protected integrated circuit 79. The SCR 52 is held in the low-impedance conducting state so long as the ESD current is flowing through the current-carrying path. At the conclusion of the ESD event, the SCR 52 reverts to its high-impedance non-conducting state and remains off until triggered by another ESD pulse at pad 77.

Figure 6:
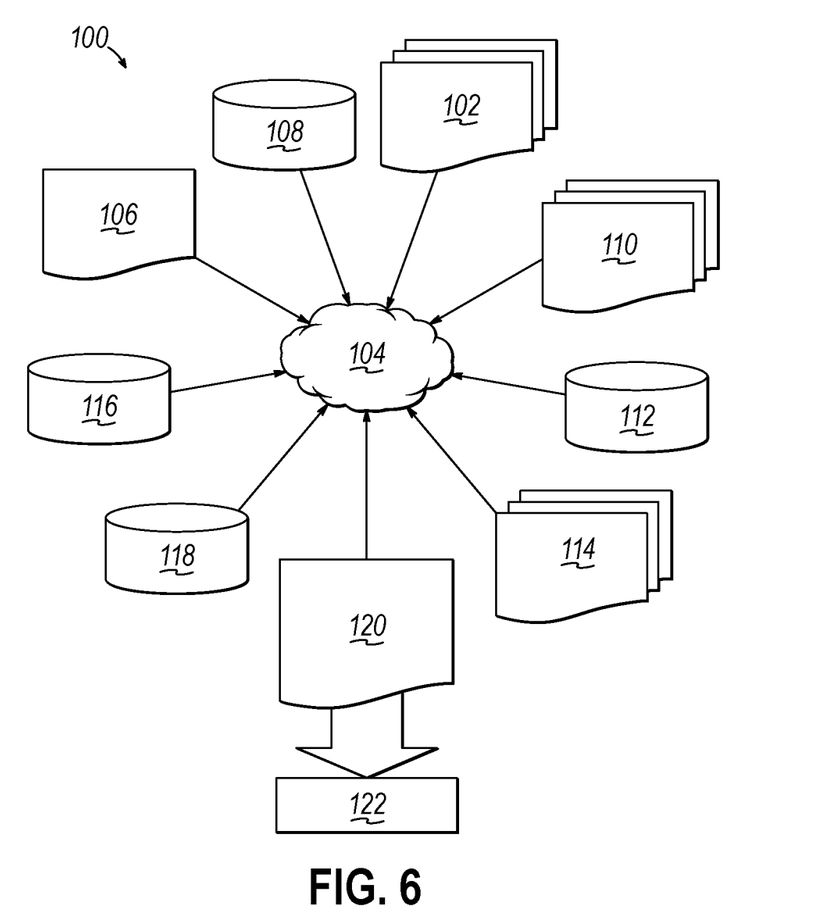
FIG. 6 is a flow diagram of a design process used in semiconductor design, manufacture, and/or test.

FIG. 6 shows a block diagram of an exemplary design flow 100 used for example, in semiconductor IC logic design, simulation, test, layout, and manufacture. Design flow 100 includes processes, machines and/or mechanisms for processing design structures or devices to generate logically or otherwise functionally equivalent representations of the design structures and/or devices described above and shown in FIGS. 3-5. The design structures processed and/or generated by design flow 100 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g., e-beam writers), computers or equipment for simulating design structures, any apparatus used in the manufacturing or test process, or any machines for programming functionally equivalent representations of the design structures into any medium (e.g., a machine for programming a programmable gate array).

Design flow 100 may vary depending on the type of representation being designed. For example, a design flow 100 for building an application specific IC (ASIC) may differ from a design flow 100 for designing a standard component or from a design flow 100 for instantiating the design into a programmable array, for example a programmable gate array (PGA) or a field programmable gate array (FPGA) offered by Altera® Inc. or Xilinx® Inc.

FIG. 6 illustrates multiple such design structures including an input design structure 102 that is preferably processed by a design process 104. Design structure 102 may be a logical simulation design structure generated and processed by design process 104 to produce a logically equivalent functional representation of a hardware device. Design structure 102 may also or alternatively comprise data and/or program instructions that when processed by design process 104, generate a functional representation of the physical structure of a hardware device. Whether representing functional and/or structural design features, design structure 102 may be generated using electronic computer-aided design (ECAD) such as implemented by a core developer/designer. When encoded on a machine-readable data transmission, gate array, or storage medium, design structure 102 may be accessed and processed by one or more hardware and/or software modules within design process 104 to simulate or otherwise functionally represent an electronic component, circuit, electronic or logic module, apparatus, device, or system such as those shown in FIGS. 3-5. As such, design structure 102 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 104 preferably employs and incorporates hardware and/or software modules for synthesizing, translating, or otherwise processing a design/simulation functional equivalent of the components, circuits, devices, or logic structures shown in FIGS. 3-5 to generate a netlist 106 which may contain design structures such as design structure 102. Netlist 106 may comprise, for example, compiled or otherwise processed data structures representing a list of wires, discrete components, logic gates, control circuits, I/O devices, models, etc. that describes the connections to other elements and circuits in an integrated circuit design. Netlist 106 may be synthesized using an iterative process in which netlist 106 is resynthesized one or more times depending on design specifications and parameters for the device. As with other design structure types described herein, netlist 106 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 104 may include hardware and software modules for processing a variety of input data structure types including netlist 106. Such data structure types may reside, for example, within library elements 108 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 110, characterization data 112, verification data 114, design rules 116, and test data files 118 which may include input test patterns, output test results, and other testing information. Design process 104 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 104 without deviating from the scope and spirit of the invention. Design process 104 may also include modules for performing standard circuit design processes such as timing analysis, verification, design rule checking, place and route operations, etc.

Design process 104 employs and incorporates logic and physical design tools such as HDL compilers and simulation model build tools to process design structure 102 together with some or all of the depicted supporting data structures along with any additional mechanical design or data (if applicable), to generate a second design structure 120. Design structure 120 resides on a storage medium or programmable gate array in a data format used for the exchange of data of mechanical devices and structures (e.g., information stored in an IGES, DXF, Parasolid XT, JT, DRG, or any other suitable format for storing or rendering such mechanical design structures). Similar to design structure 102, design structure 120 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 3-5. In one embodiment, design structure 120 may comprise a compiled, executable HDL simulation model that functionally simulates the devices shown in FIGS. 3-5.

Design structure 120 may also employ a data format used for the exchange of layout data of integrated circuits and/or symbolic data format (e.g. information stored in a GDSII (GDS2), GL1, OASIS, map files, or any other suitable format for storing such design data structures). Design structure 120 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 3-5. Design structure 120 may then proceed to a stage 122 where, for example, design structure 120: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It will be understood that when an element is described as being "connected" or "coupled" to or with another element, it can be directly connected or coupled to the other element or, instead, one or more intervening elements may be present. In contrast, when an element is described as being "directly connected" or "directly coupled" to another element, there are no intervening elements present. When an element is described as being "indirectly connected" or "indirectly coupled" to another element, there is at least one intervening element present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of fabricating a device structure, the method comprising:
    forming a first well of a first conductivity type in a device region;
    forming an anode of a first silicon controlled rectifier in the first well; and
    forming a cathode of a second silicon controlled rectifier in the first well,
    wherein the anode of the first silicon controlled rectifier has the first conductivity type and the cathode of the second silicon controlled rectifier has a second conductivity type opposite to the first conductivity type.

2. The method of claim 1 further comprising:
    forming a first trigger device for the first silicon controlled rectifier in the device region.

3. The method of claim 2 wherein the first trigger device for the first silicon controlled rectifier comprises a first diode, and further comprising:
    forming a cathode and an anode of the first diode in the device region,
    wherein the anode of the first diode comprises a doped region of the first conductivity type shared with the anode of the first silicon controlled rectifier.

4. The method of claim 3 wherein the first diode includes a first junction and the first silicon controlled rectifier includes a second junction that is aligned parallel with the first junction of the first diode.

5. The method of claim 4 wherein the second silicon controlled rectifier includes a hird junction that is aligned parallel with the first junction of the first diode and with the second junction of the first silicon controlled rectifier.

6. The method of claim 3 further comprising:
    forming a trench isolation structure that laterally separates the cathode of the first diode from the first silicon controlled rectifier.

7. The method of claim 2 further comprising:
    forming a second trigger device for the second silicon controlled rectifier in the device region.

8. The method of claim 7 wherein the second trigger device for the second silicon controlled rectifier comprises a second diode, and further comprising:
    forming a cathode and an anode of the second diode in the device region,
    wherein the anode of the second diode is shared with an anode of the second silicon controlled rectifier.

9. The method of claim 1 further comprising:
    forming a second well of the first conductivity type in the device region;
    forming a cathode of the first silicon controlled rectifier in the second well;
    forming an anode of the second silicon controlled rectifier in the second well; and
    forming a third well of the second conductivity type between the first well and the second well,
    wherein the cathode of the first silicon controlled rectifier has the second conductivity type and the anode of the second silicon controlled rectifier has the first conductivity type.

10. The method of claim 1 wherein forming the anode of the first silicon controlled rectifier in the first well comprises:
    forming a plurality of separated doped regions having the first conductivity type in the first well.

11. The method of claim 1 wherein forming the cathode of the second silicon controlled rectifier in the first well comprises:
    forming a plurality of separated doped regions having the second conductivity type in the first well.

12. The method of claim 1 wherein the device region comprises a portion of a device layer of a semiconductor-on-insulator substrate.

13. The method of claim 12 further comprising:
    forming a plurality of trench isolation structures positioned to surround the portion of the device layer,
    wherein each of the trench isolation structures extends to a top surface of a buried insulator layer of the semiconductor-on-insulator substrate.

* * * * *